United States Patent [19]

Jasper, Jr.

[11] Patent Number: 5,192,827
[45] Date of Patent: Mar. 9, 1993

[54] MICROWAVE PROJECTILE

[75] Inventor: Louis J. Jasper, Jr., Fulton, Md.

[73] Assignee: The United States of America as represented by the Secretary of the Army, Washington, D.C.

[21] Appl. No.: 810,608

[22] Filed: Dec. 19, 1991

[51] Int. Cl.⁵ ............................................. F42B 12/36
[52] U.S. Cl. .................................. 89/1.11; 102/501; 342/14; 455/98
[58] Field of Search .................... 89/1.1, 1.11, 6.5; 102/214, 293, 501, 505; 342/13, 14, 68; 455/98

[56] References Cited

U.S. PATENT DOCUMENTS

| | | | |
|---|---|---|---|
| 3,038,154 | 6/1962 | Zworykin et al. | 455/98 |
| 3,092,770 | 6/1963 | Shoemaker | 455/98 |
| 3,747,531 | 7/1973 | Powell | 102/214 |
| 3,922,968 | 12/1975 | Conger et al. | 102/214 |
| 4,196,433 | 4/1980 | Brown | 342/68 |

OTHER PUBLICATIONS

Carter, J., "Miniaturized Pulse Forming Lines", IEE Conference Record of 1982 Fifteenth Power Modulator Symposium.

Primary Examiner—Stephen C. Bentley
Attorney, Agent, or Firm—Saul Elbaum; Frank J. Dynda

[57] ABSTRACT

A high power microwave/radio frequency radiating projectile that stores electrical energy in a Pulse Forming Line network. Electrical energy is converted to high power microwave/radio frequency energy by a subnanosecond switch either in a single pulse mode or a repetition rate mode.

The high power microwave/ratio frequency energy is then radiated by an antenna built into the projectile. The heavy power supply required for providing the high voltage necessary for charging the pulse forming line network is not part of the projectile but is contained in the launching gun, or as ancillary equipment to the launching gun.

7 Claims, 8 Drawing Sheets

MICROWAVE PROJECTILE

RIGHT OF THE GOVERNMENT

The invention described herein may be used by the U.S. Government for governmental purposes without the payment to the inventors of any royalty thereon.

FIELD OF THE INVENTION

This invention relates generally to military high power microwave (HPM), radio frequency (RF), broadband, video pulse, and electromagnetic (EM) energy generation and propagation.

BACKGROUND OF THE INVENTION

Microwave sources are being developed for use in damaging and upsetting military equipment. High-power microwaves (HPM) affect systems through propagation in the air (radiation), coupling onto deliberate or unintentional apertures and antennas and conduction or radiation of the coupled EM energy to susceptible subsystems and components. Damage or failure of electrical subsystems is typified by burnout of electrical components. Interference and upset occurs when electrical subsystem performance is adversely affected and/or its state is changed.

Many varieties of microwave sources are currently being considered, designed and built. These sources have characteristics aimed at accomplishing a certain function. For example, narrowband, gigawatt sources with low to medium repetition rates ($<100H_2$) are more suited for damage and burnout.

On the other hand, lower power, wideband, megawatt sources with high repetition rates ($>100H_2$) are more suited for upset since lower power generally is required to upset a system. However, for both burnout and upset it is highly desirable to place as much power and energy on target consistent with tactical considerations. Gigawatt sources are required to place watts of power on targets that are several kilometers away because the microwave power attenuates approximately inversely proportionally to the distance squared. The microwave power that is attenuated by $1/R^2$ is also attenuated by the atmosphere. A dedicated microwave emitter/radiator must utilize the microwave windows (0.1 to 22, 35, 94, 140, or 220 $GH_2$) to ensure their reliability. Sea level, rain, snow, and fog also provide significant microwave attenuation.

Atmospheric and $1/R^2$ distance attenuation considerations are extremely important in microwave propagation; therefore, it is highly desirable to place the source as close to the target as possible and feasible in order to minimize the $1/R^2$ and atmospheric attenuations. This can be accomplished by flying the microwave source on air platforms i.e., missiles, satellites, or unmanned aerial vehicles (UAVs) This requirement restricts the design and construction of the source since its size and weight are restricted and hence its performance. Another technique is to utilize a chemical explosion to generate the microwaves which can also be placed in the vicinity of the target. This technique is expensive and does not allow one to readily tailor the radiation pulse and repetition rate for optimum results.

Accordingly, it is an object of the present invention to provide an improved means of placing a high power microwave source in the vicinity of targets with a compact projectile in a highly effective manner.

It is another object of the present invention to tailor the radiation pulse(s) to produce maximum effect on targets.

It is a further object of the present invention to provide a microwave projectile that does not carry the heavy power supply required for providing the charging power to the projectile, but leaves the heavy power supply behind when the projectile is launched.

SUMMARY OF THE INVENTION

Briefly, the foregoing and other objects are achieved by a microwave projectile that stores DC energy in a Pulse Forming Line (PFL), converts DC to RF by use of a subnanosecond switch and radiates the pulse when in the vicinity of the targets by means of a timing circuit and antenna. The energy is stored and packaged in a cylindrical format and delivered to targets by a specially designed gun utilizing conventional propellant means, or other more advanced launching means such as all electric power, thermal power, or hybrids thereof.

Compactness is achieved by charging the PFL's directly before firing, from an external power supply. Numerous projectiles can be charged in parallel from a power supply which size is dependent upon the charging rate desired.

BRIEF DESCRIPTION OF THE DRAWINGS

The invention will be better understood, and further objects, features, and advantages thereof will become more apparent from the following description of the preferred embodiments, taken in conjunction with the accompanying drawings in which.

BRIEF DESCRIPTION OF THE INVENTION

Figure 1:
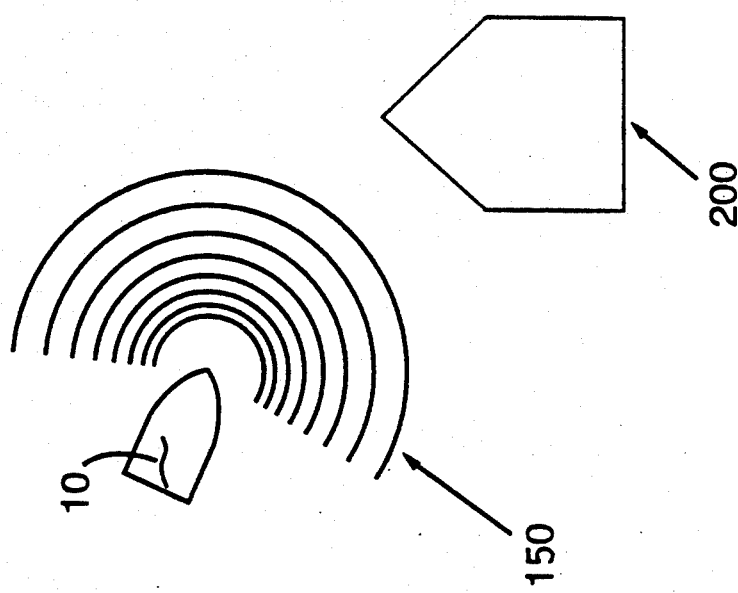
FIG. 1 is a representation of the Microwave Projectile System.
Figure 1:
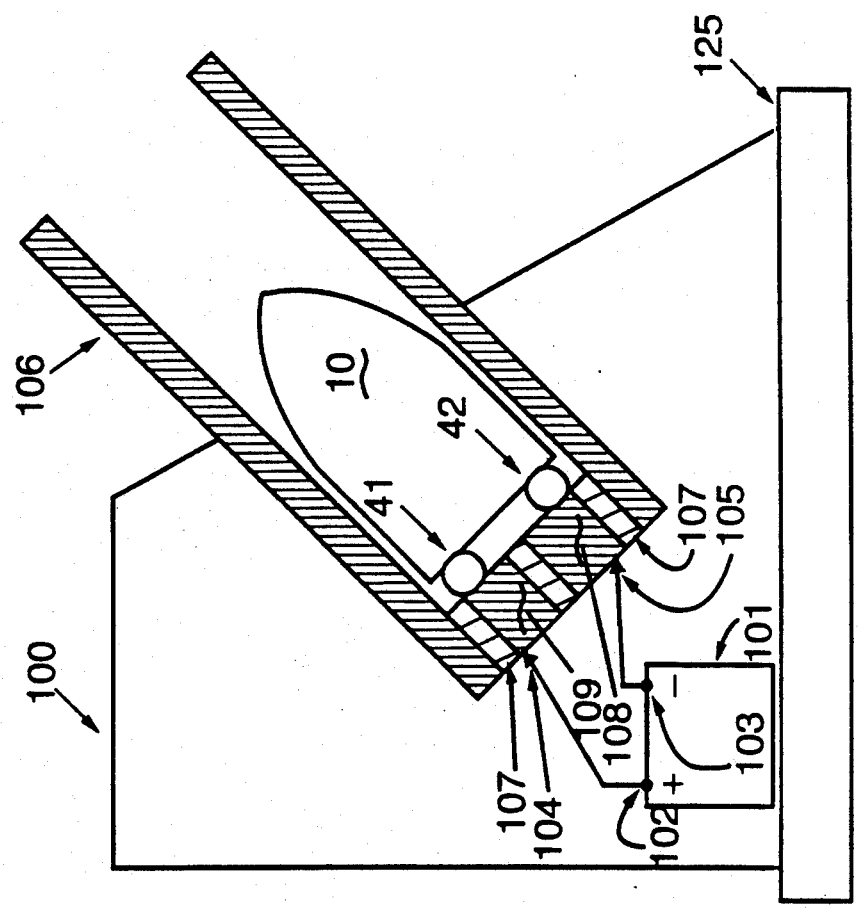
Figure 2:
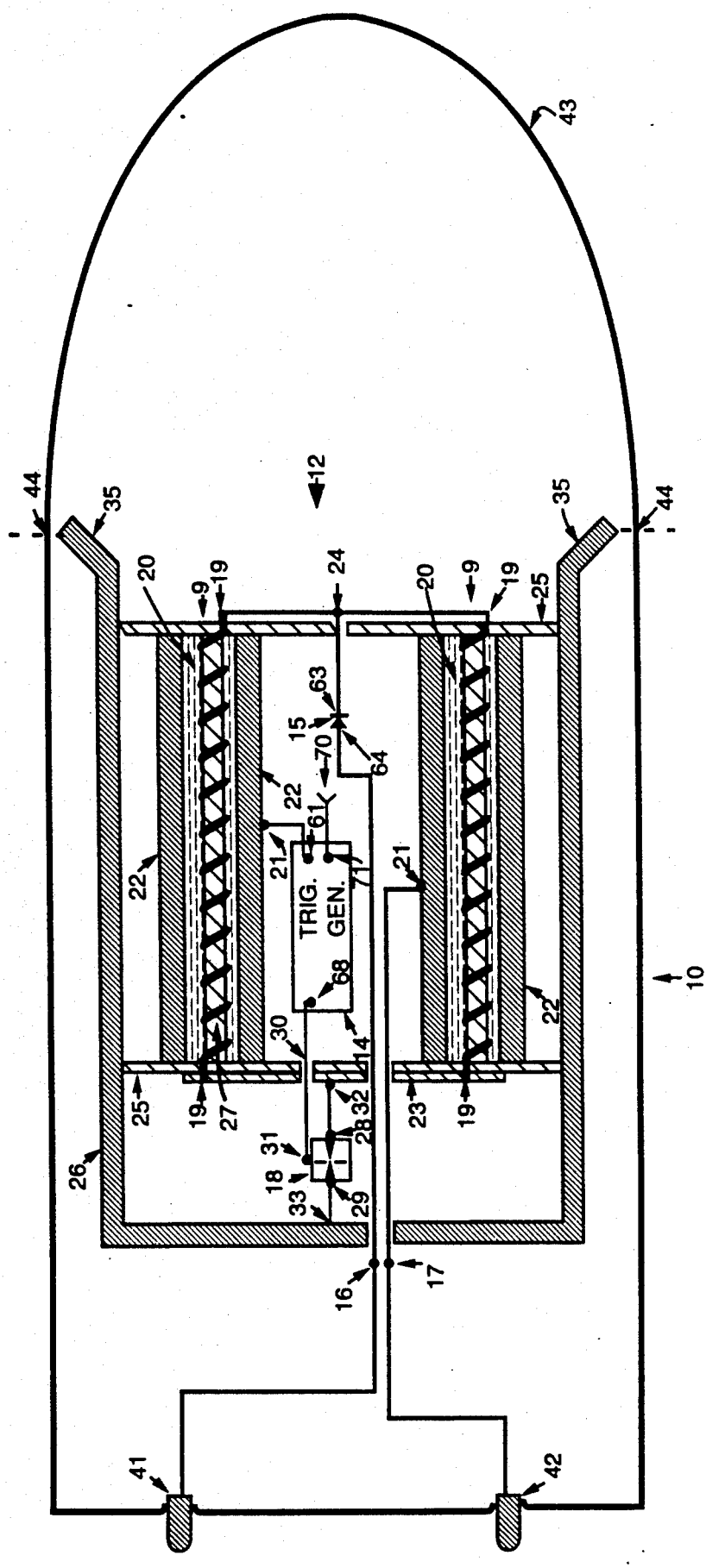
FIG. 2 is a representation of the Microwave Projectile with a single pulse microwave generator.
Figure 3:
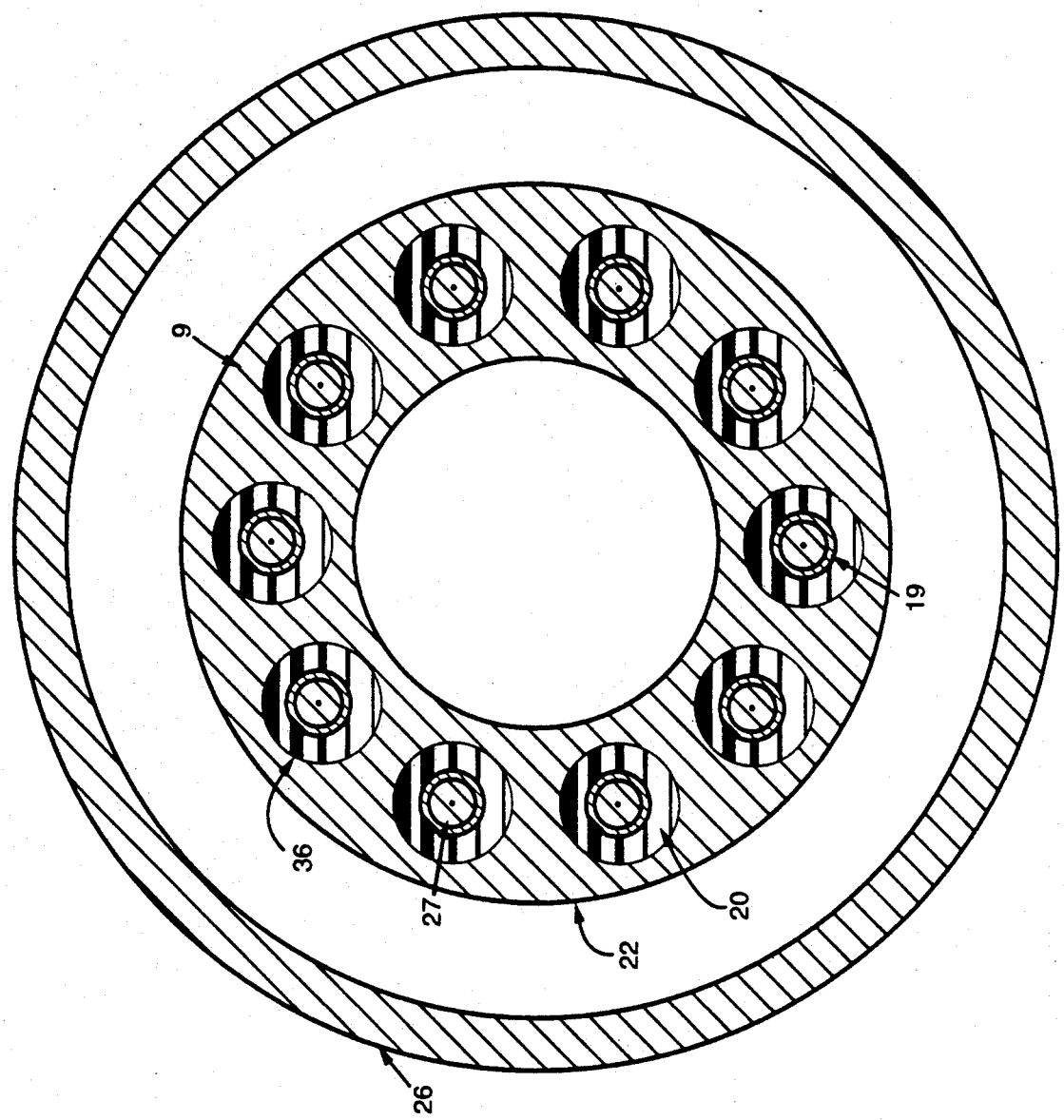
FIG. 3 is a view of the layout of the mechanical components of the pulse forming lines.
Figure 4:
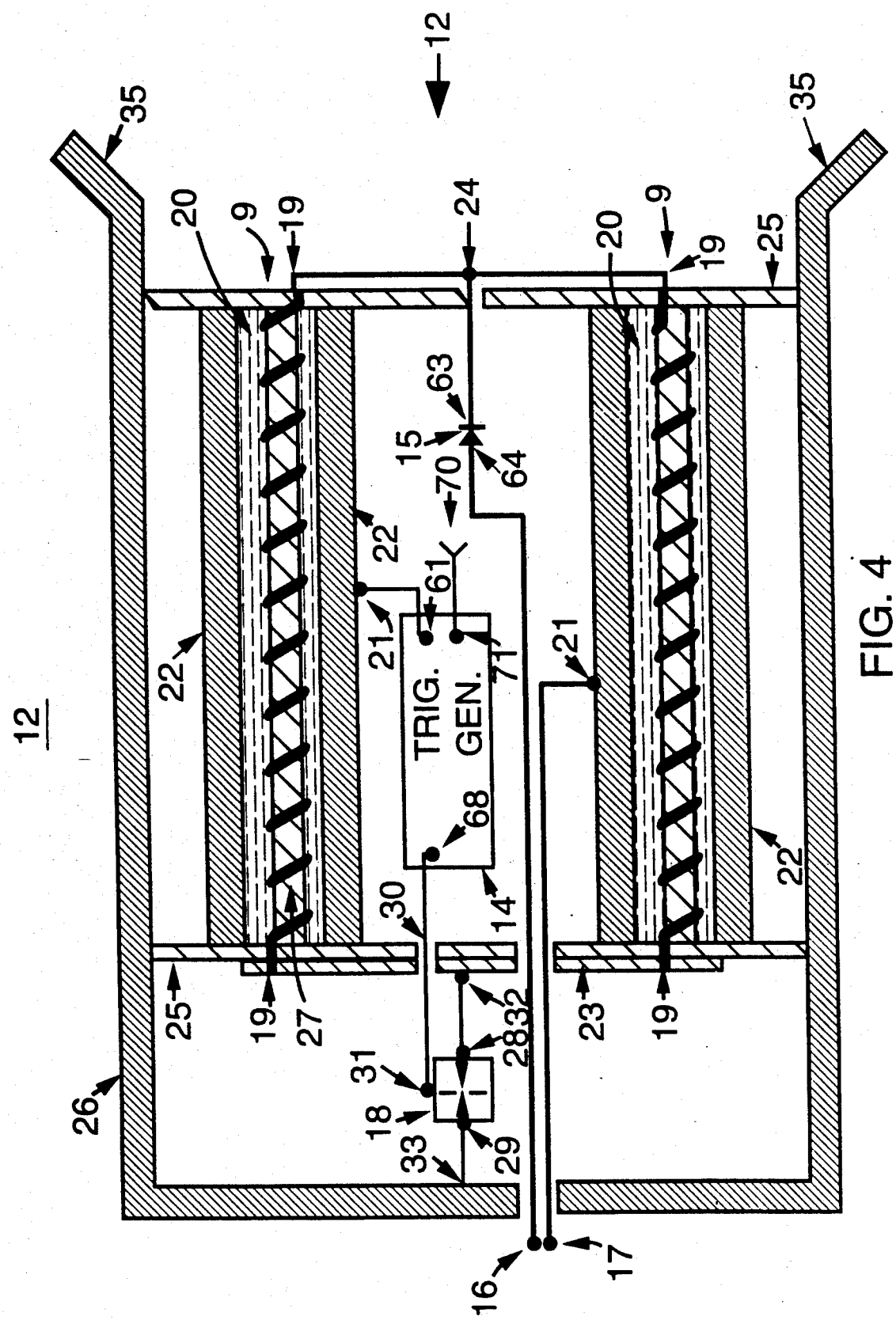
FIG. 4 is a representation of the components of the single pulse microwave generator.
Figure 5:
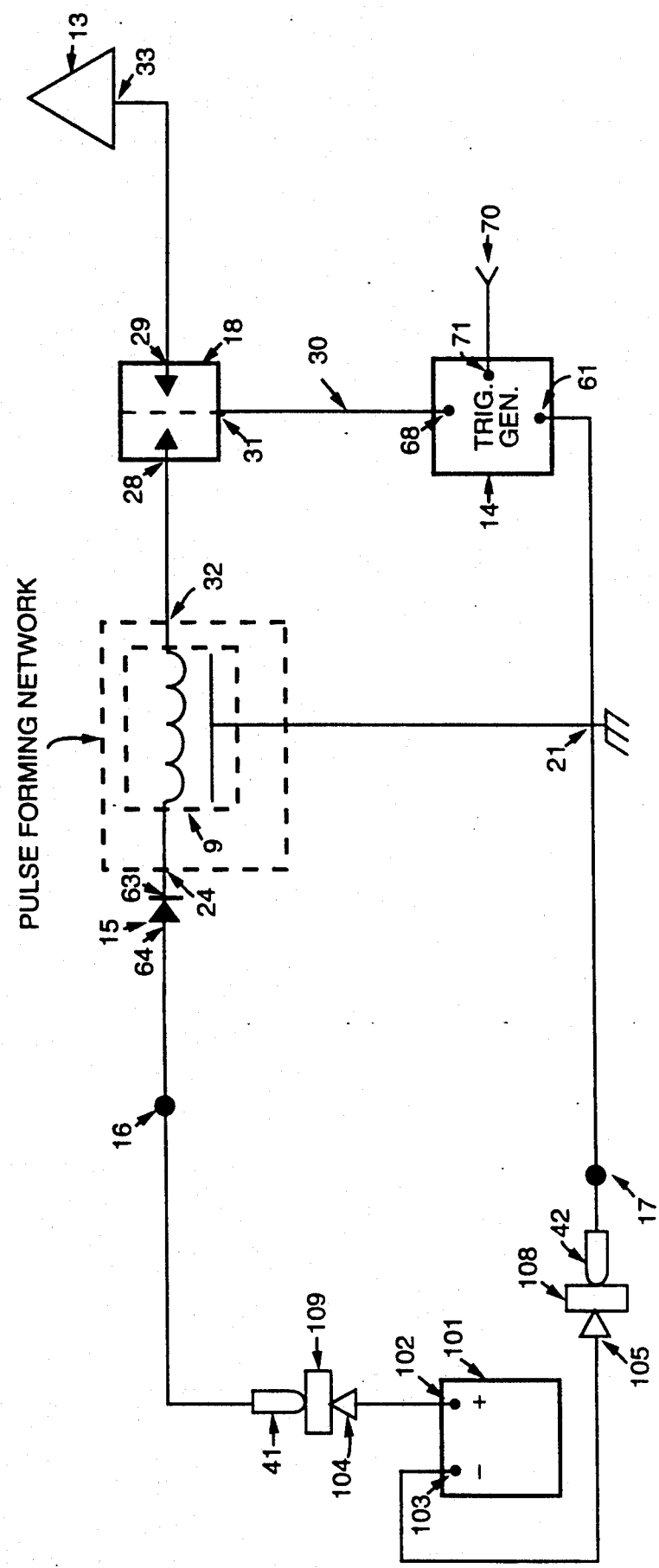
FIG. 5 is a schematic of the single pulse microwave generator.

The invention utilizes a Pulse Forming Line (PFL) to store DC energy. The PFL is designed to store 10's to 1000's of joules of energy for a short period of time. The PFL is charged by a power supply of the type used for high power DC charging and is well known by people in the power generation field. Numerous PFL's are charged in parallel at rates determined by the power supply. The PFL's are charged immediately prior to firing since power will drain off the PFL due to dielectric losses. One embodiment is a PFL in a coaxial format since coax accepts DC and TEM modes. The PFL is designed to store maximum energy with minimum current leakage. To deliver the microwave projectile down range 5 to 10 kilometers, several seconds are required at a velocity of about 2 Km/sec. Therefore, minimum leakage is required over a period of several seconds. The impedance of the PFL should be a few ohms since the match into an antenna that will operate with a size small compared to a wavelength would have a low impedance. The length of the projectile is restricted by delivery considerations and may be less than desirable for achieving a long pulse width since the pulse width is determined by the velocity of the pulse on the PFL and twice the length of the PFL. The velocity of the pulse on the PFL is equal to $C/(e_r u_r)^{\frac{1}{2}}$ where C is the velocity of light, $e_r$ is the dielectric constant, and $u_r$ is the relative permeability of the dielectric in the PFL. A closing switch is utilized such as a solid-state semiconductor switch, a superconductive switch, a spark-gap switch, or a krytron switch to achieve subnanosecond risetimes. The speed of the closing switch and circuit inductance will determine the pulse risetime. A subnanosecond pulse risetime is required to generate a video or wideband frequency pulse. The switch need only perform over the short operating life of the expendable source so this requirement reduces the switch life time (cycle) consideration. It is a one time, closing switch for a single pulse mode and for operation in a repetitive mode the switch must close and open at the repetition rate until all the energy is expended from the PFL and storage capacitors.

The timing circuit is well-known to people in fuzing technology. The timing circuit allows one to control the time and place that the DC stored energy is converted to RF energy.

The antenna is also well-known to people in the antenna field. The size of the antenna is restricted by the delivery means. A dielectric cavity backed antenna with a dielectric constant tailored for the proper frequency response is desirable to reduce size and increase the low frequency response as well as bandwidth for a given size. The antenna for a projectile application is small compared to a wavelength, therefore, its impedance is only several ohms. A TEM horn, monocone, array of dipoles, or a conformal spiral(Log-periodic) can be used as antennas. A simple constant impedance antenna is desirable. A wideband antenna is required to radiate a wideband frequency pattern.

The PFL, switch, timing circuit, antenna, and related circuitry are packaged into a cylindrical projectile format. The power supply that charges the PFL's in the projectile prior to firing stays behind with the launching gun and is not part of the projectile.

DETAILED DESCRIPTION OF THE PREFERRED EMBODIMENTS

Referring to FIG. 1, reference numeral 125 represents a platform upon which is mounted a launching gun 100 for launching a projectile 10 which after launching radiates high power radiation 150 towards a target 200. Launching gun 100 contains a high voltage DC charging supply 101 which charges the projectile 10 prior to launching via connections 102 and 103, the positive and negative power supply terminals respectively. The propelling mechanism is not shown as it may be conventional or all electric or a hybrid configuration and would be designed and detailed by those skilled in the art. Terminals 104 and 105 contact electrical feedthrough connections 109 and 108 respectively. Inside the gun barrel or gun barrel feed mechanism 106, terminals 41 and 42 contact the other side of terminals 109 and 108 respectively. This allows the high voltage DC charging power to be connected to the projectile 10 while the projectile is inside the gun barrel or the gun barrel feed mechanism 106. The feedthrough connectors 108 and 109 can be configured by those skilled in the art and can be located anywhere on the launching gun 100 or gun feed mechanism where best suited and depends upon the type of launching gun being utilized. Insulation 107 surrounds the feed-through connectors 108 and 109. The high voltage power supply 101 can be disconnected prior to or while launching the projectile 10. This will depend upon the particular gun used and feed mechanism considerations. Also, the high voltage DC charging supply 101 and ancillary equipment can be external to the gun and feed mechanism. This would allow one to charge numerous projectiles in parallel and in addition to design the projectiles to be form, fit, and function with a particular launching gun.

Figure 6:
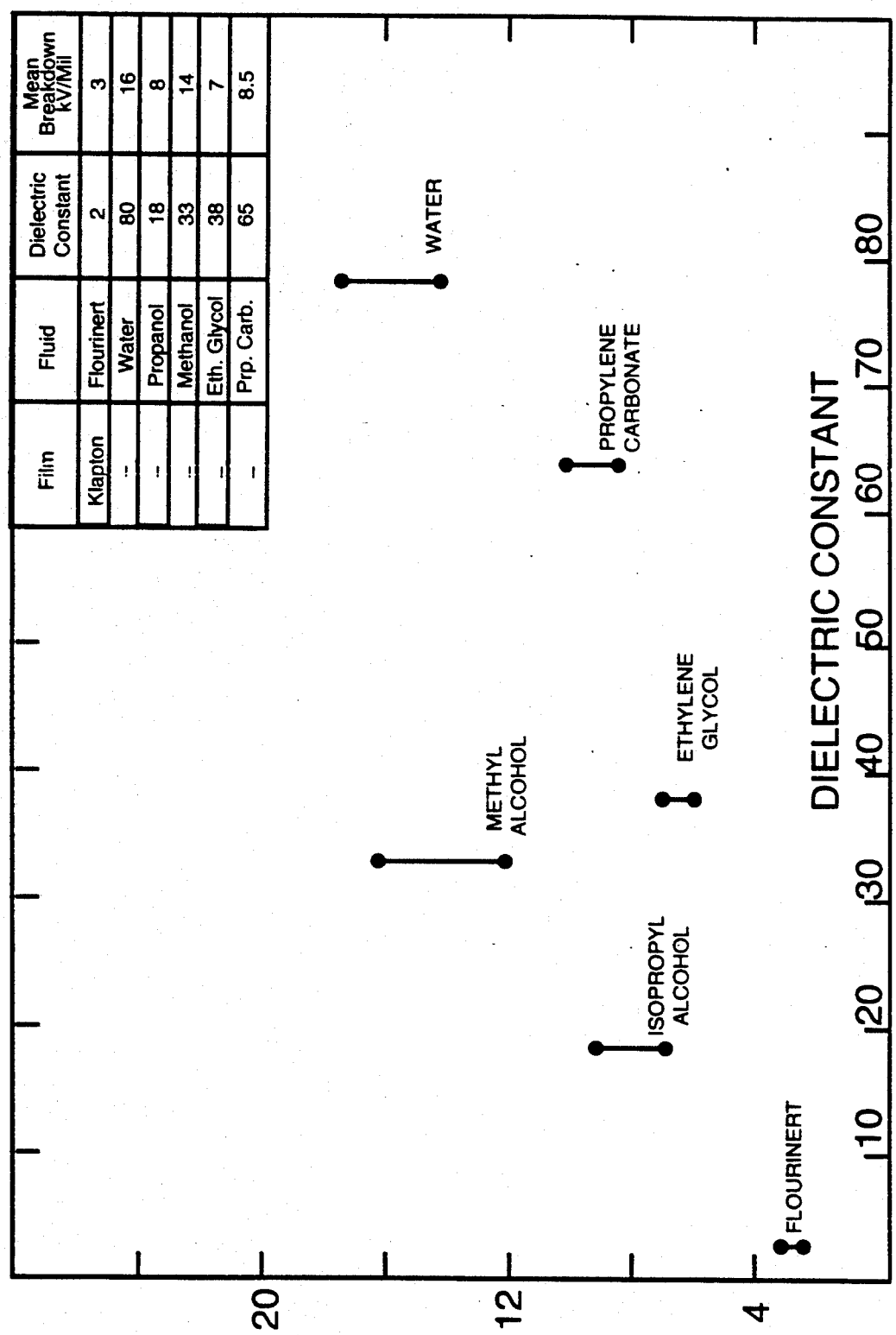
FIG. 6 is a chart of the dielectric constants and voltage breakdown strengths for representative liquid dielectrics.

FIGS. 2, 3, 4, and 5 show a single pulse high power microwave projectile. The single pulse High Power Microwave (HPM) generator 12 is located inside of projectile 10 at a suitable place for microwave radiation to be propagated through the microwave transparent nose cone 53. The antenna 13 consists of the body shell 26 and flare 35 for impedance matching to the atmosphere. The projectile nose cone 43 can be made to breakaway at points 44, with existing technology, which points represent two points on the circumference of projectile 10 at the antenna flare 35 location, or the nose cone 43 can be made out of a material that is transparent to HPM. The plus high voltage DC power enters on connection 16. The high voltage return path is on connection 17. Terminals 16 and 17 connect to the high voltage charging connections 41 and 42 respectively. The high voltage DC power connects to the anode 64 of hold-off diode 15. The cathode 63 of diode 15 connects to the junction 24 of the pulse forming line inductors 19. The Volume between the inductor 19 and the wall of a cylindrical PFL cavity 36 centered in the thick wall of metal cylinder 22 contains a dielectric liquid 20 selected from one of the liquids listed in FIG. 6. These liquid dielectrics 20 are: FLOURINERT (trademark), WATER, PROPANOL, METHANOL, ETHYLENE GLYCOL, and PROPYLENE CARBONATE. Other dielectric liquids or solids with similar properties can be used. The favorable properties for the dielectric liquid are a high dielectric constant (for highenergy storage); low loss tangent (low loss to achieve high repetition rates and to avoid current leakage); and high breakdown strength in kv/mm,(for compactness and to avoid arcing due to atmospheric breakdown). The liquid 20 must also be environmentally stable for altitude, temperature variation, vibration, and acceleration for example.

This dielectric liquid 20, together with the inductors 19 and cylindrical PFL cavities 36, Create a PFL capacitance 11 which stores the electrical energy provided by the High Voltage DC Power Supply 101. The pulse forming lines 9 consist of inductors 19, dielectric liquid 20, solid dielectric support rods 27 and the cylindrical PFL cavities 36. The cylindrical PFL cavities 36 are drilled in the wall of the thick-walled metal cylinder 22 with the cylindrical PFL cavities 36 placed evenly around and centered in the thick outer wall of 22, with the axis of the PFL cavities 36 parallel with the axis of the thick-walled metal cylinder 22. The PFL cavities 36 contain the PFL's 9. The inductors 19 are helical wire coils which are supported on solid dielectric support rods 27. The other ends of the inductors 19 are connected electrically via a metal disc 23 which is further connected to the subnanosecond switch 18 at terminal 25, by a connection from point 32 on the disc 23. The other end of the subnanosecond switch 18 is connected to the antenna 13 at connection 33, by a connection from terminal 29 on subnanosecond switch 18. Trigger terminal 31 of the subnanosecond switch 18 is connected to the trigger output 30 of the single pulse trigger generator 14 at terminal 68. The trigger generator 14 is also connected via terminal 61 to the ground reference 22 at connection 21. The trigger generator is known to those in the art and is an off the shelf type of generator. It can be internally powered by a small long shelf life battery, or it can obtain power from the charging supply 101 during prefire charging operations and can store the small energy it requires in a miniature high capacity storage capacitor within the trigger generator 14. The electronics consisting of the trigger generator 14, holdoff diode 15, and the subnanosecond switch 18 are centered in the projectile 10, and are generally contained within the inner cavity of the metal cylindrical volume 22.

Solid dielectric discs 25 insulate and support the metal cylindrical volume 22 from the antenna 13, body shell 26, and antenna flare 35. Upon receipt of a timing signal 70, at terminal 71, trigger generator 14 sends a trigger signal 30 to subnanosecond switch 18, at terminal 31, the subnanosecond switch 18 closes. The timing signal 70 can be provided by a timing circuit or a fuze on board the projectile. This timing signal 70 is a standard type known to those who work in this field, as is the fuze or timing circuit used to provide the timing signal. The pulse forming lines (PFLs) 9 discharge through said switch 18 creating a pulse of high power microwave/radio frequency (HPM/RF) current which flows into antenna 13 and radiates into space.

In one embodiment there are ten PFLs in parallel charged to a voltage of 50 Kv. Each PFL has a length of 6 inches, an impedance of 50 ohms, and a peak power of 12.5 megawatts.

The peak RF power is $V^2/R$ where V is the voltage and R is the resistance. The capacitance 11 of the PFL is given by $c=0.0024\, e'_r/\text{Log}(D/d)$ Farads/cm where $e'_r$ is the relative dielectric constant of the liquid, d is the outer diameter of PFL inductance coil 19, and D is the diameter of the PFL cavity 36 in the wall of metal Cylinder 22. In this embodiment D=1.43 cm and d=1.27 cm. Therefore $c=4.66 \times 10^{-12} e'_r$ farads.

TABLE 1 gives the design parameters for the PFL 9 using the following three liquid dielectrics:
ethylene glycol with $e'_r=38$
propylene carbonate with $e'_r=68$
water with $e'_r=80$

TABLE 1

DESIGN PARAMETERS FOR THE PFL

| PARAMETER | ETHYLENE GLYCOL | PROPYLENE CARBONATE | WATER |
|---|---|---|---|
| Capacitance (F/cm) | $1.77 \times 10^{-10}$ | $3.17 \times 10^{-10}$ | $3.73 \times 10^{-10}$ |
| Inductance (H/cm) | $4.43 \times 10^{-7}$ | $7.93 \times 10^{-7}$ | $9.33 \times 10^{-7}$ |
| (Discharge) Delay time (sec./cm) | $17.7 \times 10^{-9}$ | $31.7 \times 10^{-9}$ | $37.2 \times 10^{-9}$ |
| Impedance (ohms) | 50 | 50 | 50 |

The inductance L and delay (Discharge) time T of the PFL 9 are calculated by the following:

$$L = Z^2 C \text{ and } T = 2(LC)^{\frac{1}{2}}$$

where Z=impedance of the PFL and is equal to 50 ohms. The inductance $L = uN^2 \pi^2 A^2 \times 10^{-4}$ H/cm.

The three dielectric liquids in Table 1 were compared with a constant impedance of 50 ohms. The inductance is made consistent for each dielectric liquid by varying the mean diameter A of the inductance coil 19, the number of turns N per centimeter of the inductance coil 19, and the relative permeability u of the liquid dielectric.

The stored energy and pulsewidth for the 6 inch (15.24 cm) long PFL with a charging voltage of 50 KV is given in Table 2 for the same three liquid dielectrics. The pulsewidth is arrived at by multiplying the PFL 9 delay time from TABLE 1 by 6 inches and then multiplying again by 2.54 centimeters per inch to obtain a value in nanoseconds. The stored energy is equal to the peak power times the pulsewidth.

TABLE 2

STORED ENERGY AND PULSEWIDTH FOR THE PFL

| PARAMETER | ETHYLENE GLYCOL | PROPYLENE CARBONATE | WATER |
|---|---|---|---|
| Stored Energy (joules) | 3.37 | 6.04 | 7.11 |
| Pulsewidth (nanoseconds) | 270 | 483 | 567 |

Ten PFL's 9 are placed near the inner circumference of the projectile shell 26 and isolated electrically from the shell. Allowing for minimum space between the inductor coils 19, and since the liquid dielectrics 20 considered can withstand a minimum of 8 KV/mm, the mean circumference of the ten inductor coils is about 17 cm. This allows 0.27 cm spacing between PFL's 9. The 10 PFL's 9 fit into a 9 centimeter (3.5 in.) diameter shell. A larger diameter shell would allow one to use more than 10 PFL's 9. The ten PFL's 9 give an effective impedance of 5 ohms. The stored energy, peak power, and current delivered to a 5 ohm load inside the projectile are given in Table 3 for the same three dielectric liquids.

TABLE 3

PEAK POWER, PEAK CURRENT, AND STORED ENERGY DELIVERED TO A 5 OHM LOAD

| PARAMETER | ETHYLENE GLYCOL | PROPYLENE CARBONATE | WATER |
|---|---|---|---|
| Peak Current (kiloamps) | 5 | 5 | 5 |
| Peak Power (megawatts) | 125 | 125 | 125 |
| Energy (joules) | 33.7 | 60.4 | 71.1 |

The peak current of 5 KA in Table 3 considers that one half of the charging voltage (25 KV) is across the load (antenna 13). This gives a 50% efficiency.

Figure 7:
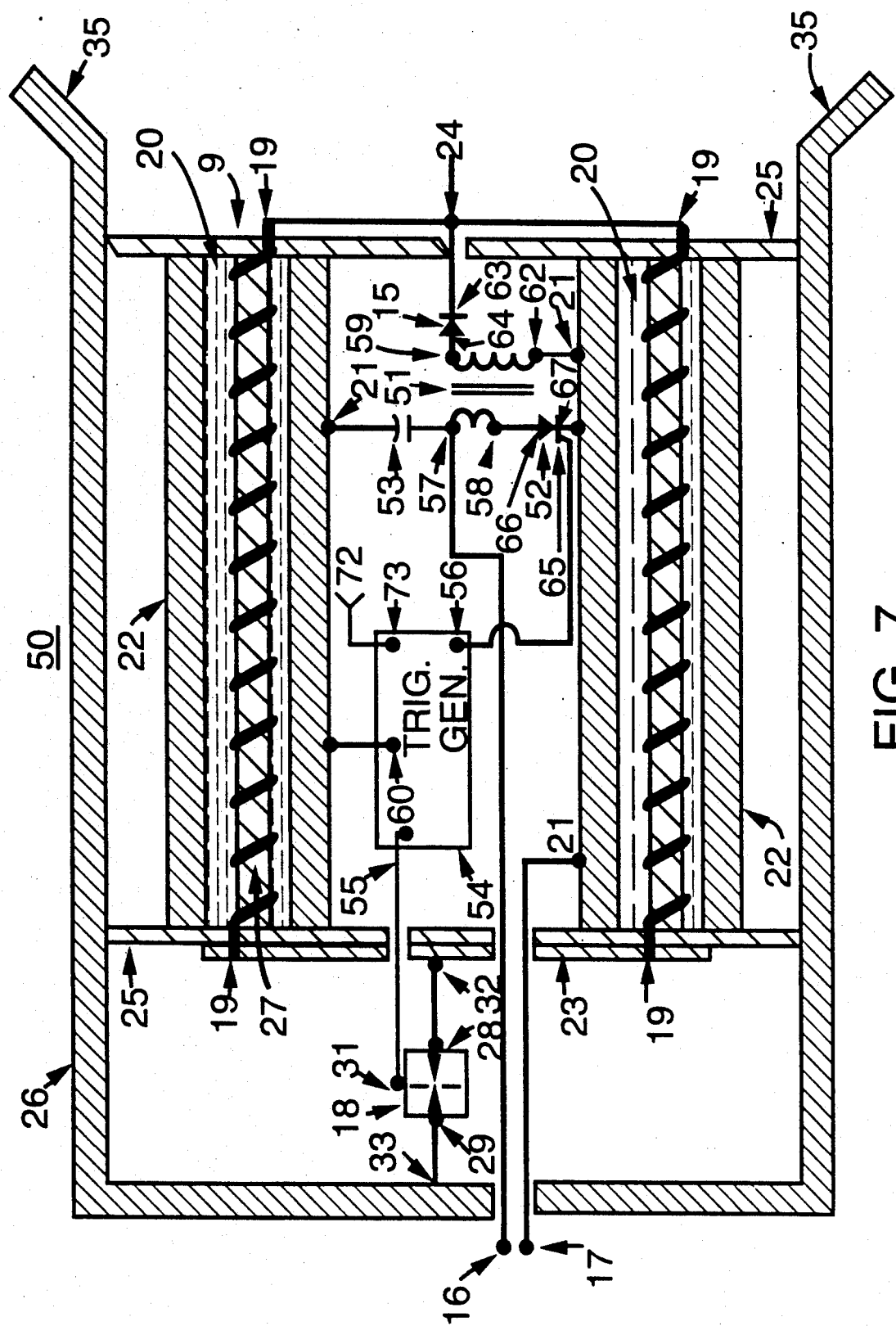
FIG. 7 is a representation of the components of the repetition rate microwave generator.
Figure 8:
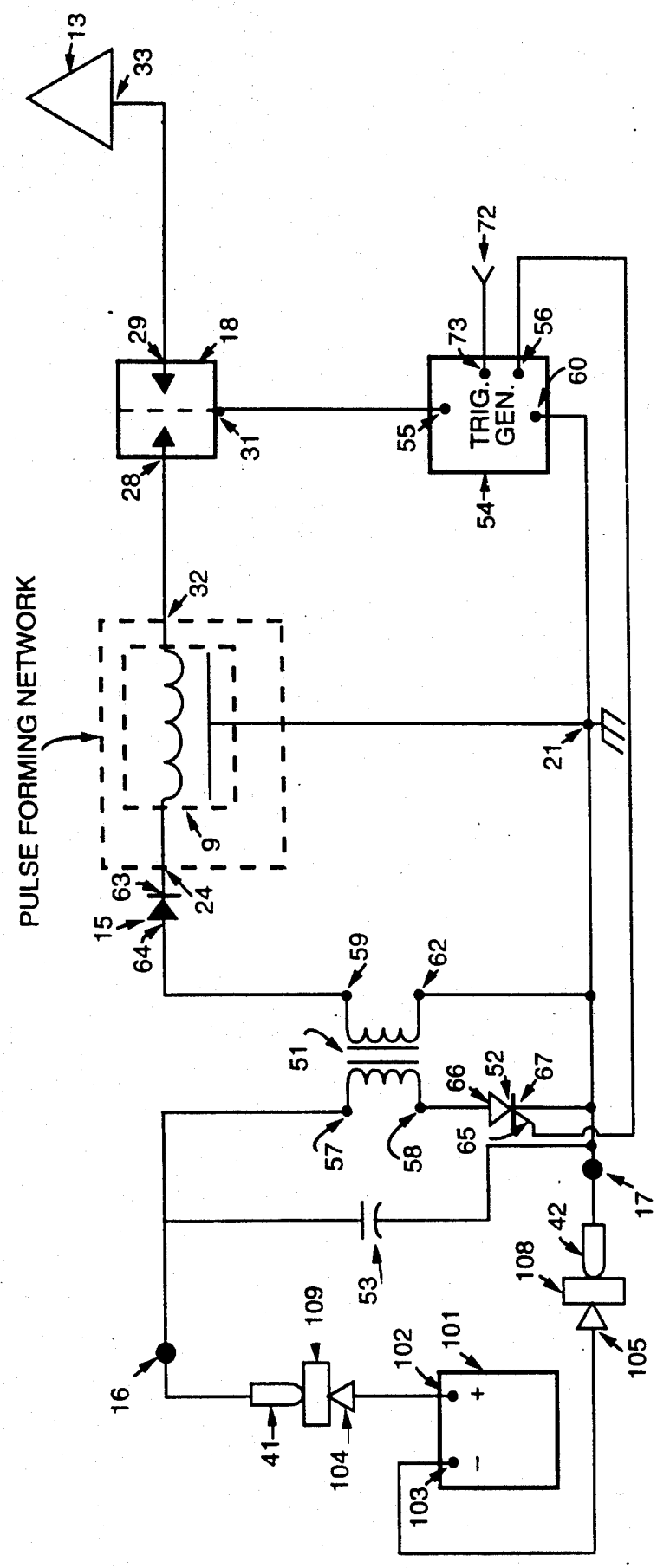
FIG. 8 is a schematic of the repetition rate microwave generator.

Referring to FIGS. 7 and 8, the repetition rate High Power Microwave Generator 50 utilizes a high energy density storage capacitor 53 to store electrical energy which is inputted on terminals 16 and 17, from the remote high voltage charging power supply 101. The storage capacitor 53 is connected to a pulse transformer 51 winding at terminal 57, the other end of this winding 58 is connected to the anode 66 of a silicon controlled rectifier 52, the cathode 67 being connected to ground 21. The gate 65 of the silicon controlled rectifier 52 is connected to an output 56 of a dual output trigger generator 54. The other output 55 of the signal generator 54 is connected to the initiation terminal 31 of the subnanosecond switch 18. The dual trigger generator 54 also has a terminal 60 referenced to ground 21. The holdoff diode 15 anode 64 is connected to an output terminal 59 of pulse transformer 51. The other terminal 62 of the pulse transformer 51 is Connected to ground 21. The pulse forming lines 9 are connected to the holdoff diode 15 and to the subnanosecond switch 18 as described above for the single pulse HPM embodiment. A timing signal 72, similar to the timing signal 70 discussed above for the single pulse HPM/RF generator 12 is inputted On terminal 73 of the repetition rate trigger generator 54 having dual trigger outputs. The subsequent trigger outputs 55 and 56 of the dual output trigger generator 54 are timed so that for each output 55 and 56 of the dual trigger generator 54 some energy is transferred from the storage capacitor 53 to the Pulse Forming Lines 9 which then together with the subnanosecond opening/closing switch 18 produces repeated pulses of HPM/RF energy which are radiated by antenna 13.

In an embodiment of a repetition rate HPM generator, a 5 KV charging power supply 101, capacitor 53, and a 1 to 10 pulse transformer 51 provide 50 KV to the PFL's 9 through holdoff diode 15. The total energy available to be transferred to the PFL's 9 is dependent upon the capacity of the storage capacitor 53; therefore, the capacitor 53 should have high-energy density storage capability for compactness. The repetition rate desired is determined by the timing of the dual output trigger generator 54, the turn-on and turn-off speeds of the subnanosecond switch 18, and the electrical characteristics of the PFL$_s$ 9.

What is claimed is:

1. A microwave radio frequency radiation projectile system for radiating a single pulse of high power microwave/radio frequency (HPM/RF) energy comprising a projectile comprising a body with a portion of said body transparent to microwave/radio frequency radiation thereby allowing microwave/radio frequency energy to propagate through said portion of said body, means for generating high power microwave/radio frequency energy, means for radiating high power microwave/radio frequency energy, means for storing electrical energy, means for charging said projectile with electrical energy prior to launching, and means for launching said projectile wherein said system further comprises:
   a plurality of pulse forming lines for storing said electrical energy,
   a subnanosecond switch for converting said stored electrical energy in said pulse forming lines to high power microwave/radio (HPM/RF) frequency energy,
   an antenna for radiating said high power microwave radio frequency energy, and
   a timing circuit for initiating said subnanosecond switch.

2. A HPM/RF radiation projectile system for radiating repetitive pulses of HPM/RF energy comprising a projectile comprising a body with a portion of said body transparent to microwave/radio frequency radiation thereby allowing microwave/radio frequency energy to propagate through said portion of said body, means for radiating high power microwave/radio frequency energy, means for storing electrical energy, means for charging said projectile with electrical energy prior to launching, and means for launching said projectile wherein said system further comprises:
   a high energy density storage capacitor,
   a pulse transformer having one end of a primary winding connected to said high energy density storage capacitor and having the other end of said primary winding connected to the anode of a silicon controlled rectifier,
   a second winding of said pulse transformer connected through a holdoff diode to said plurality of pulse forming lines,
   a subnanosecond switch connected between said plurality of pulse forming lines and an antenna, and
   a trigger generator with a timing signal input further comprising a first output connected to the gate of said silicon controlled rectifier and a second output connected to said subnanosecond switch to initiate said subnanosecond switch causing said energy storage capacitor to repetitively charge said pulse forming lines and further causing said subnanosecond switch to repetitively turn on and off thereby producing a repetitive train of HPM/RF pulses to be radiated by said antenna.

3. A HPM/RF radiation projectile as in claim 1 or 2 wherein each of said pulse forming lines comprises:
   a co-axial inductor supported on a dielectric rod
   a cylindrical volume of liquid dielectric surrounding said co-axial inductor, and
   a cylindrical volume of conductive metal surrounding said cylindrical volume of liquid dielectric.

4. A HPM/RF radiation projectile as in claim 3 wherein said liquid dielectric is selected from the group consisting of:
   fluorinert, ethylene glycol, isopropyl alcohol, propylene carbonate, methyl alcohol, and water.

5. A HPM/RF radiation projectile as in claim 1 or 2 wherein said subnanosecond switch is a spark gap, a krytron, a laser activated switch, a semiconductor switch, or a super-conductive switch.

6. A HPM/RF radiation projectile as in claim 1 or 2 wherein said antenna is a dielectric cavity backed antenna, a TEM horn, a monocone, an array of dipoles, or a conformal spiral log-periodic antenna.

7. A HPM/RF radiation projectile as in claim 6, wherein said antenna is contained on or within the physical dimensions of said projectile so as to maintain the aerodynamic integrity of said projectile.

* * * * *